(12) United States Patent
Morris et al.

(10) Patent No.: US 10,720,438 B2
(45) Date of Patent: Jul. 21, 2020

(54) MEMORY ARRAY WITH FERROELECTRIC ELEMENTS

(71) Applicant: Intel Corporation, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,835

(22) Filed: Sep. 28, 2018

(65) Prior Publication Data

US 2020/0105771 A1     Apr. 2, 2020

(51) Int. Cl.
*H01L 27/11507*     (2017.01)
*H01L 49/02*     (2006.01)
(Continued)

(52) U.S. Cl.
CPC ........ *H01L 27/11507* (2013.01); *H01L 23/16* (2013.01); *H01L 23/3675* (2013.01); *H01L 23/562* (2013.01); *H01L 25/0657* (2013.01); *H01L 25/18* (2013.01); *H01L 28/40* (2013.01); *H01L 29/7851* (2013.01); *H01L 2225/06517* (2013.01); *H01L 2225/06548* (2013.01);
(Continued)

(58) Field of Classification Search
CPC ......... H01L 27/11502; H01L 27/11507; H01L 29/516
See application file for complete search history.

(56) References Cited

U.S. PATENT DOCUMENTS 9,147,606 B2 *  9/2015  Liaw ................... H01L 23/5226
10,043,854 B1 *  8/2018  Shin .................... H01L 27/2436
(Continued)

FOREIGN PATENT DOCUMENTS

WO    2018125024 A1    7/2018

OTHER PUBLICATIONS

Cutress, "Intel and Micron to Dissolve 3D XPoint Partnership after 2019", AnandTech, Jul. 16, 2018, three pages, https://www.anandtech.com/show/13083/intel-and-micron-update-3d-xpoint-road map-combined-effort-2nd-gen-3rd-gen-separate.
(Continued)

*Primary Examiner* — Raj R Gupta
(74) *Attorney, Agent, or Firm* — Trop, Pruner & Hu, P.C.

(57) ABSTRACT

An embodiment includes a system comprising: first, second, and third word lines on a semiconductor material; first, second, and third channels; first, second, and third capacitors including a ferroelectric material; a bit line; first, second, third, fourth, and fifth semiconductor nodes, wherein the first semiconductor node couples the first capacitor to the first channel, the second semiconductor node couples the bit line to the first channel; the third semiconductor node couples the second capacitor to the second channel, the fourth semiconductor node couples the third capacitor to the third channel, and the fifth semiconductor node couples the bit line to the third channel; wherein the first channel has a long axis and a short axis; wherein the long axis intersects a continuous, uninterrupted portion of the semiconductor material from the first channel to the third channel.

25 Claims, 8 Drawing Sheets

(51) Int. Cl.
H01L 29/78 (2006.01)
H01L 25/18 (2006.01)
H01L 25/065 (2006.01)
H01L 23/367 (2006.01)
H01L 23/00 (2006.01)
H01L 23/16 (2006.01)

(52) U.S. Cl.
CPC .............. H01L 2225/06555 (2013.01); H01L 2225/06589 (2013.01)

(56) References Cited

U.S. PATENT DOCUMENTS

2007/0026629 A1* 2/2007 Chen .............. H01L 21/823412 438/424
2010/0078711 A1* 4/2010 Goldbach ......... H01L 29/66795 257/329
2018/0122478 A1 5/2018 Morris et al.

OTHER PUBLICATIONS

Micheloni et al., "Architectural and Integration Options for 3D NAND Flash Memories", Computers, Aug. 10, 2017, pp. 1-19, vol. 6 Issue 3, MDPI AG, Basel, Switzerland.
Wikipedia, "Charge trap flash", May 30, 2018, nine pages, https://en.wikipedia.org/wiki/Charge_trap_flash.
Wikipedia, "Thin-film transistor", Jun. 28, 2018, three pages, https://en.wikipedia.org/wiki/Thin-film_transistor.
Wikipedia, "System in package", Jun. 29, 2018, two pages, https://en.wikipedia.org/wiki/System_in_package.
Wikipedia, "Package on package", Jun. 24, 2018, four pages, https://en.wikipedia.org/wiki/Package_on_package.
Wikipedia, "Ferroelectric RAM", Aug. 21, 2018, six pages, https://en.wikipedia.org/wiki/Ferroelectric_RAM.
Wikipedia, "Ferroelectricity", Jul. 1, 2018, seven pages, https://en.wikipedia.org/wiki/Ferroelectricity.
Wikipedia, "Flash memory", Aug. 28, 2018, 23 pages, https://en.wikipedia.org/wiki/Flash_memory.
Das, "Intel's Embedded DRAM: New Era of Cache Memory", EE Times, Aug. 7, 2014, six pages, https://www.eetimes.com/author.asp?doc_id=1323410.
James, "The Confab—Semi Industry is Now Mature", Solid State Technology, Dec. 6, 2013, 49 pages, https://electroiq.com/chipworks_real_chips_blog/author/sdavis/page/3/.
James, "Recent Innovations in DRAM Manufacturing", Conference Paper, Aug. 2010, seven pages, Chipworks, Inc.
Tallis, "Micron 3D NAND Status Update", AnandTech, Feb. 12, 2016, four pages, https://www.anandtech.com/show/10028/micron-3d-nand-status-update.
Sheldon, "NAND flash memory basics: Comparing SLC, MLC and TLC NAND", Tech Target, Nov. 20, 2017, three pages, https://searchstorage.techtarget.com/feature/NAND-flash-memory-basics-Comparing-SLC-MLC-and-TLC-NAND.
Walker, "Samsung's 3D V-NAND Flash Product—The Spires of El Dorado?", 3D InCites, Aug. 12, 2014, two pages, https://www.3dincites.com/2014/08/samsungs-3d-vnand-flash-product-spires-el-dorado/.
Tai et al., "Photosensitivity Analysis of Low-Temperature Poly-Si Thin-Film Transistor Based on the Unit-Lux-Current", IEEE Transactions on Electron Devices, Jan. 2009, pp. 50-56, vol. 56, No. 1, Institute of Electrical and Electronics Engineers.
Alcorn, "WD's Big Advantage: BiCS3 64-Layer 3D NAND Coming This Year", Tom's Hardware, Jul. 26, 2016, three pages, https://www.tomshardware.com/news/wd-sandisk-bics3-64-layer-3d-nand,32328.html.
Polinksy, "Dynamic Random Access Memory—DRAM", Introduction to DRAM Technology, Aug. 28, 2001, 36 pages, Rochester Institute of Technology—Microelectronic Engineering.

* cited by examiner

700

```
┌─────────────────────────────────────────────────────────┐
│ Forming a monolithic fin that includes a semiconductor  │
│ material. The monolithic fin is formed at once and is   │
│ contiguous and maintains a relatively consistent height │
│ and width from one end of the fin to the opposing end   │
│ of the fin.                                             │
└─────────────────────────────────────────────────────────┘ 701
                            ↓
┌─────────────────────────────────────────────────────────┐
│ Forming first, second, third, and fourth channels in    │
│ the fin.                                                │
└─────────────────────────────────────────────────────────┘ 702
                            ↓
┌─────────────────────────────────────────────────────────┐
│ Forming first, second, third, fourth, fifth, and sixth  │
│ semiconductor nodes in the fin.                         │
└─────────────────────────────────────────────────────────┘ 703
                            ↓
┌─────────────────────────────────────────────────────────┐
│ Forming first, second, third, and fourth word lines on  │
│ the fin, wherein the first channel is between a bottom  │
│ of the fin and the first word line, the second channel  │
│ is between the bottom of the fin and the second word    │
│ line, the third channel is between the bottom of the    │
│ fin and the third word line, and the fourth channel is  │
│ between the bottom of the fin and the fourth word line. │
└─────────────────────────────────────────────────────────┘ 704
                            ↓
┌─────────────────────────────────────────────────────────┐
│ Forming first, second, third, and fourth capacitors,    │
│ wherein the first, second, and third capacitors include │
│ ferroelectric materials.                                │
└─────────────────────────────────────────────────────────┘ 705
                            ↓
┌─────────────────────────────────────────────────────────┐
│ Forming a bit line, wherein the first semiconductor     │
│ node couples the first capacitor to the first channel,  │
│ the second semiconductor node couples the bit line to   │
│ the first channel, the second semiconductor node        │
│ couples the bit line to the second channel; the third   │
│ semiconductor node couples the second capacitor to the  │
│ second channel, the fourth semiconductor node couples   │
│ the third capacitor to the third channel, the fifth     │
│ semiconductor node couples the bit line to the third    │
│ channel, the fifth semiconductor node couples the bit   │
│ line to the fourth channel, and the sixth semiconductor │
│ node couples the fourth capacitor to the fourth channel.│
└─────────────────────────────────────────────────────────┘ 706
```

MEMORY ARRAY WITH FERROELECTRIC ELEMENTS

TECHNICAL FIELD

Embodiments of the invention are in the field of semiconductor devices and, in particular, memory.

BACKGROUND

Scaling of memory, such as dynamic random-access memory (DRAM), is challenging in part due to lithography constraints. For example, DRAM memory cells may include an access transistor and a capacitor. As those memory cells are more aggressively scaled, it becomes increasingly difficult for circuit designers to formulate memory arrays where operating one memory cell avoids undesirable interference with an adjacent memory cell. Such interference can result in, for example, the loss of data stored within the adjacent memory cell. To prevent this interference, the adjacent memory cells may be separated from each other using insulation techniques (e.g., shallow trench isolation (STI)). However, accurate location of such insulation materials between tightly spaced adjacent memory cells is increasingly difficult as scaling increases.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIG. 7 includes a method in an embodiment.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements cooperate or interact with each other, but they may or may not be in direct physical or electrical contact.

As mentioned above, manufacturing memory is increasingly difficult as scaling (e.g., minimum pitch) becomes more extreme. Applicant determined such scaling issues are particularly onerous when patterning, for example, access transistors for memory cells.

For instance, such memory cells may include FinFET access transistors. A FinFET is a transistor built around a vertical fin of semiconductor material (referred to as the "fin"). The transistor includes the standard field effect transistor (FET) nodes/components: a gate, a gate dielectric, a source region, and a drain region.

Figure 1A:
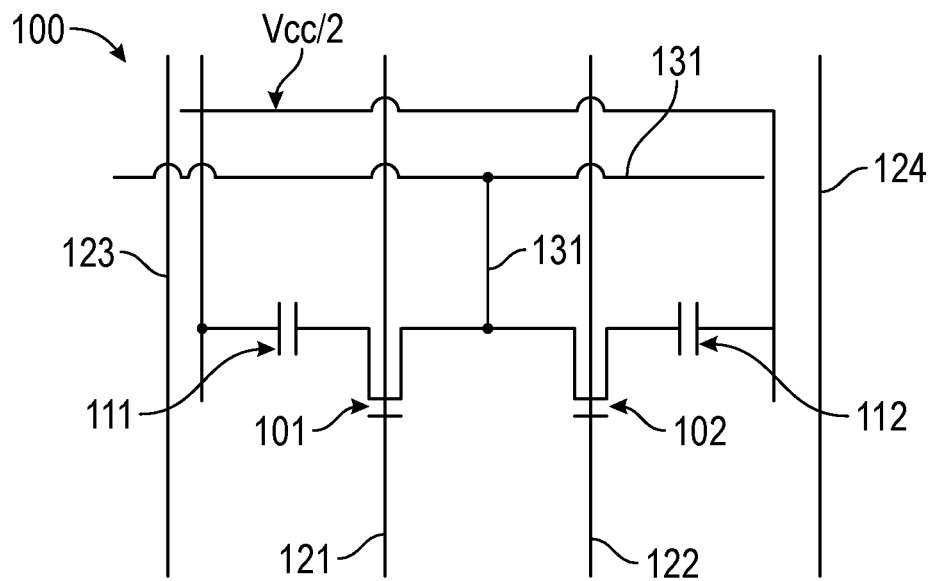
FIG. 1A provides a schematic representation of a conventional memory array.
Figure 1B:
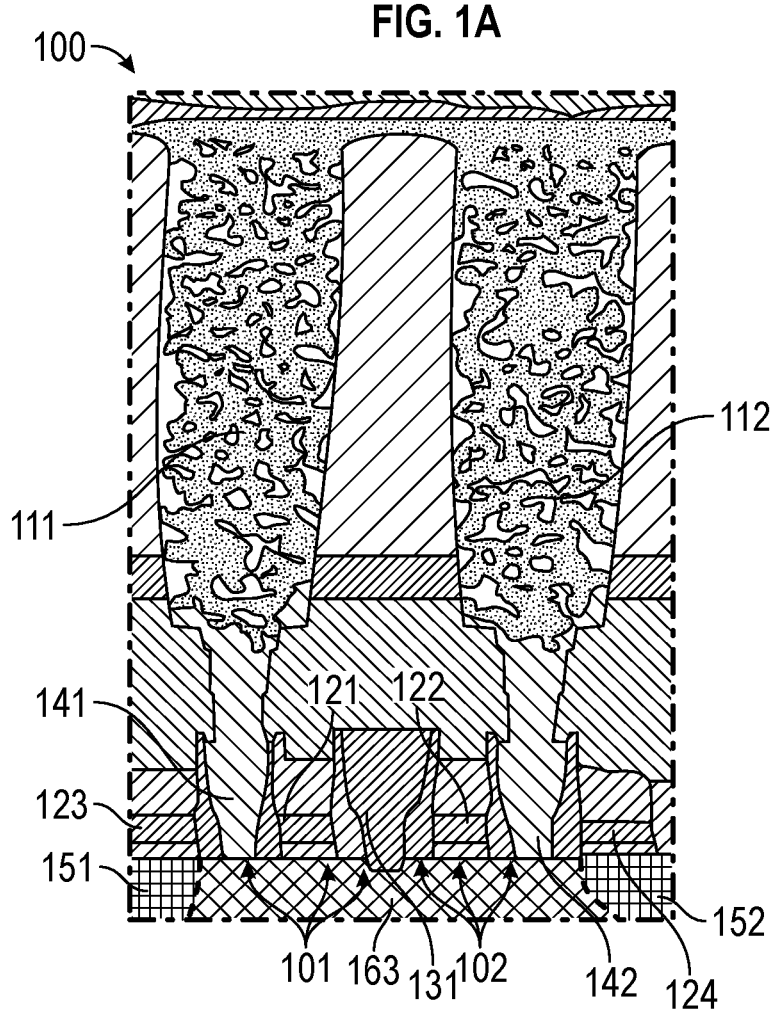
FIG. 1B provides a cross-section of a rendition of the array of FIG. 1A.
Figure 1C:
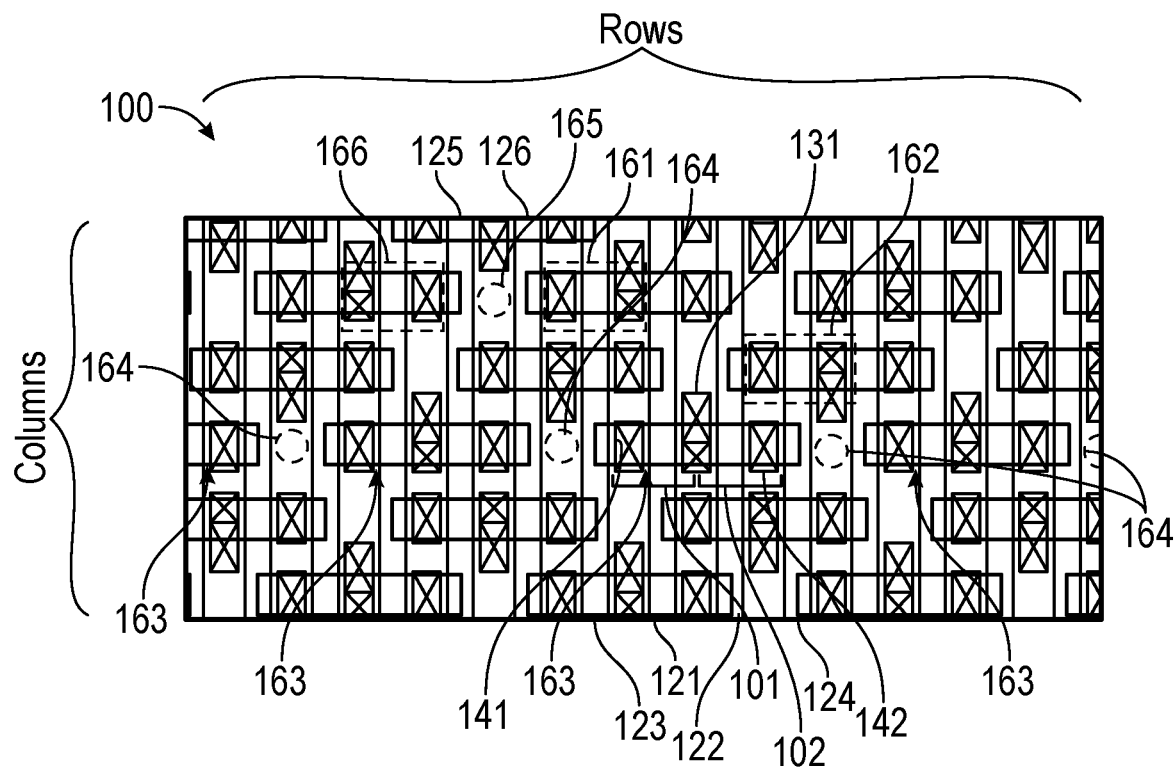
FIG. 1C provides a top view of a layout scheme for the array of FIG. 1A.

FIGS. 1A, 1B, and 1C illustrate the issues with FinFET access transistor patterning identified by Applicant. FIG. 1A provides a schematic representation of a conventional memory array. FIG. 1B provides a cross-section of a rendition of the array of FIG. 1A. FIG. 1C provides a top view of a layout scheme for the array of FIG. 1A. FIGS. 1A, 1B, and 1C are addressed concurrently below.

Array 100 provides two "1T-1C" (one transistor, one capacitor) memory cells. Array 100 includes gate metal (e.g., word lines 121, 122, 123, 124), diffusion (e.g., fin 163), and contacts (e.g., 131, 141, 142). The diffusion/fin has 2D patterning and is at a tight pitch. More specifically, a first memory cell includes transistor 101 and capacitor 111 and a second memory cell includes transistor 102 and capacitor 112. Word line 121 activates transistor 101 while word line 122 activates transistor 102. Bit line (see contact 131 that leads to a bit line) couples to both memory cells. Word lines 123, 124 are "passing" word lines that "pass" the two memory cells (which include transistors 101 and 102) on their way to operate other cells, such as cells 161, 162. Passing word lines 123, 124 are isolated from access transistors 101, 102 by STI portions 151, 152. In FIG. 1C passing word line 123 passes over an unseen STI region (which is shown in FIG. 1B). STI is used to isolate bitcells not only in the same row (vertically aligned in image) but also in the same column (horizontally aligned) in the image.

Further, fin 163 has portions 164 removed from the fin in order to isolate memory cells from neighboring memory cells. For example, the removal of fin material at space 165 helps to isolate cell 161 from cell 166. While FIG. 1C does not show bit lines or capacitors for the memory cells, the figure does show contact locations for bit lines (see contact 131) and capacitors (see contacts 141, 142).

Again, at extremely small scales selectively removing fin portions (see locations 164, 165) and selectively forming STI 151, 152 is quite difficult. However, doing so is traditionally needed so, for example, memory cell 166 and/or passing word lines 125, 126 do not affect the stored data of memory cell 161.

With regard to DRAM in particular, in DRAM or embedded DRAM (eDRAM) with conventional capacitors the diffusion (e.g., fin) connecting to the storage node of one bit cell (e.g., a source or drain node coupled to a capacitor of a memory cell) must be electrically isolated from the storage node of an adjacent bit cell. However, patterning the isolation region between diffusions is challenging because the patterning is two-dimensional and at an extremely tight pitch. Depending on the layout style used, the diffusion/isolation patterning is either the tightest pitch or the second tightest pitch in the entire DRAM product.

In contrast, an embodiment utilizes capacitors that are more robust or resistant to the above mentioned interference. For instance, embodiments use ferroelectric capacitor memory to store data in the memory cells. While ferroelectric capacitor memory provides advantages for lower power and scalability with regard to conventional memory cells, another advantage is that with ferroelectric memory diffusion patterning (e.g., forming FinFETs) may be highly simplified and thus allow for more cost effective scaling.

More specifically, an embodiment includes a memory cell (sometimes referred to as a "bitcell") that uses the non-volatile property of ferroelectric capacitors to store data even when a storage node of the memory cell is not isolated. Although the diffusion (e.g., a fin) is continuous (lacks areas such as area 165 of FIG. 1C) and the array includes passing word lines that have the capability to turn "on" adjacent memory cells (due to parasitic capacitance on the passing word line), the electrical coupling related to the parasitic capacitance does not result in data loss due to, for example, the qualities of ferroelectric capacitors.

Because embodiments include a diffusion (e.g., fin) that is a continuous, homogeneous, one dimensional pattern, the embodiments are highly scalable and low cost. This is because removal of fins (e.g., area 165) and accurate placement of STI (151, 152) is no longer essential considering the data is preserved due to ferroelectricity.

Ferroelectric memory refers to a memory technology employing ferroelectric materials. A ferroelectric material is a material that exhibits, over some range of temperatures, a spontaneous electric polarization (i.e., displacement of positive and negative charges from their original position), that can be reversed or reoriented by application of an electric field. Because the displacement of the charges in ferroelectric materials can be maintained for some time even in the absence of an electric field, such materials may be used to implement memory cells. A ferroelectric material may include anti-ferroelectric materials as well.

Embodiments using ferroelectric memories provide adequate non-volatility, short programming time, low power consumption, high endurance, and high speed writing. In addition, such embodiments may be manufactured using processes compatible with the standard complementary metal-oxide-semiconductor (CMOS) technology.

A ferroelectric memory cell disclosed herein includes one non-planar access transistor and one ferroelectric capacitor. The non-planar access transistor could be a tri-gate or an all-around gate transistor. Other embodiments may include planar transistors, Reces s-Channel-Array-Transistors (RCAT), and the like. An access transistor is coupled to the ferroelectric capacitor by sharing its source/drain terminal with one electrode of the ferroelectric capacitor and is used for both READ and WRITE access to the ferroelectric capacitor. The ferroelectric material employed in the ferroelectric capacitor may include, for example, materials exhibiting ferroelectric behavior at thin dimensions, such as hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and yttrium), lead zirconate titanate (which is a material that includes lead, zirconium, and titanium), barium zirconate titanate (which is a material that includes barium, zirconium and titanium), and combinations thereof. Some embodiments include hafnium, zirconium, barium, titanium, and/or lead, and combinations thereof.

Figure 2A:
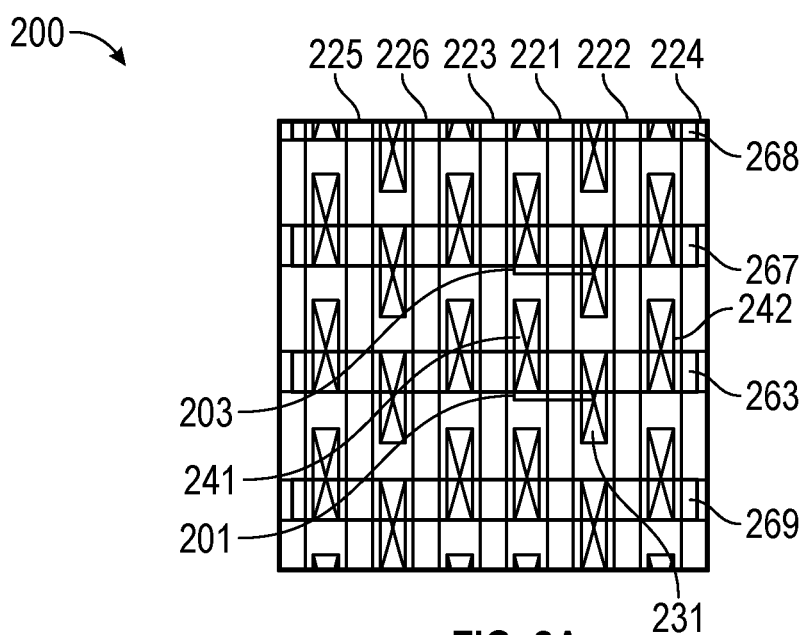
FIG. 2A provides a top view of a layout scheme for a memory array in an embodiment.

FIG. 2A provides a ferroelectric eDRAM 200 layout in an embodiment. Gate metal is in word lines 225, 226, 223, 221, 222, 224, diffusion areas are in fins 268, 267, 263, 269, and metal is in source/drain (S/D) contacts (e.g., 241, 242 to couple to memory cell capacitors (that are not shown) and 231 to couple to a bit line that is not shown). Unlike FIGS. 1B and 1C, the diffusion/fin 263 uses a single dimension pattern without complicated STI patterning. Electrical isolation is achieved between adjacent storage nodes (e.g., nodes with a standard FinFET operating in the subthreshold regime) due to the characteristics of the ferroelectric capacitors. Further, in some embodiments even though transistor 201 may be turned on as the word line 221 is used to access transistor 203, no data is lost within the memory cell that includes transistor 201 due to the ferroelectric nature of the capacitor of the memory cell that includes transistor 201.

Due to the lack of isolation between passing word line 223 and bitcell word line 221 (for transistor 201), the DRAM controller in an embodiment operates in a way such that word lines 221, 221 are not on at the same time in order to preserve the data for the cell that includes transistor 201.

Figure 2B:
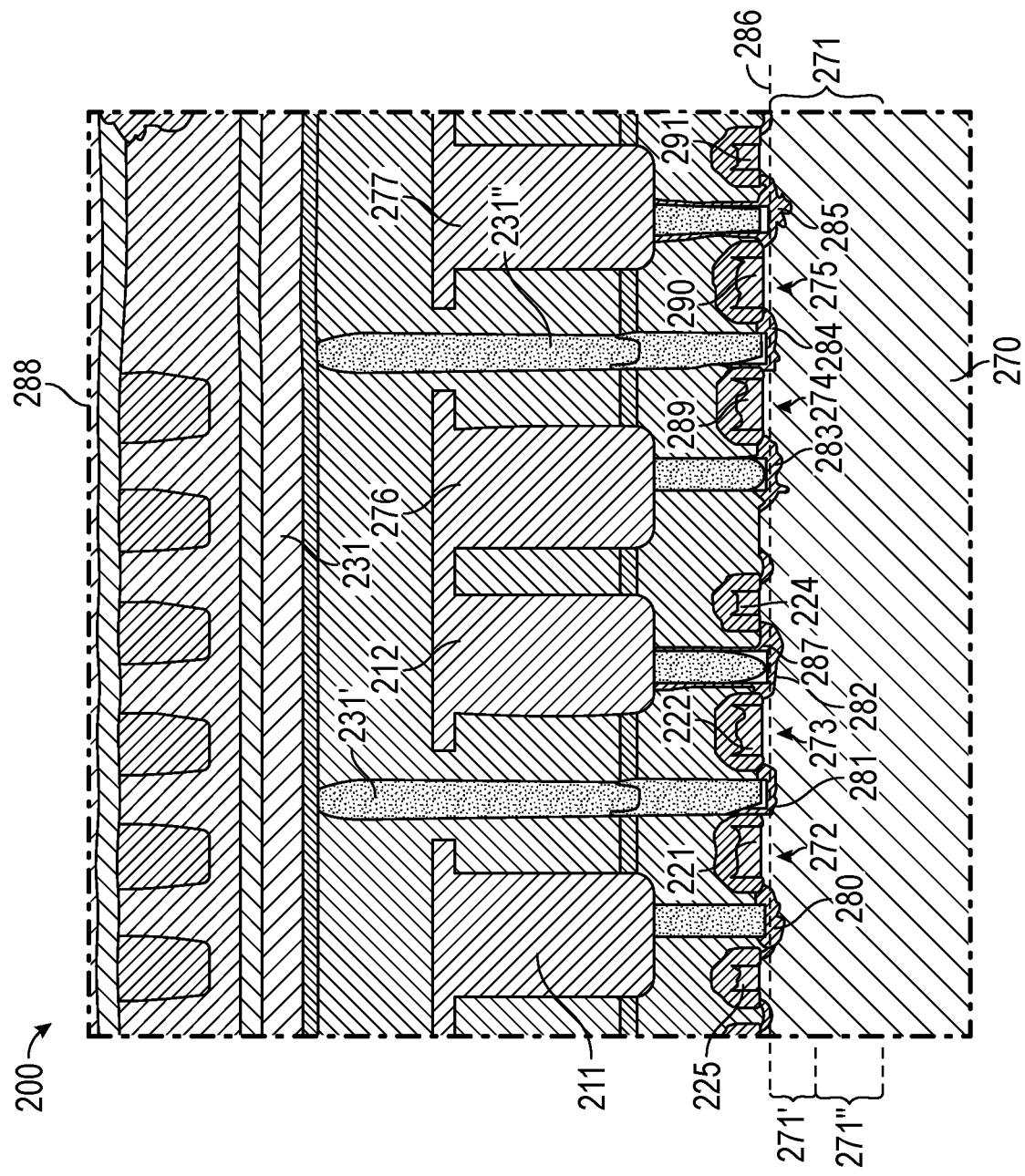
FIG. 2B provides a cross-section of a rendition of the array of FIG. 2A.

FIG. 2B includes a cross-section of a portion of the array of FIG. 2A. Array 200 includes a substrate 270. The substrate may include a front end with transistors included therein. However, the substrate may instead include a substrate such as package substrate 703 of FIG. 3 (described below). Array 200 includes a monolithic fin 271 on the substrate 703. By "monolithic" the fin does not include gaps such as gap 165 of FIG. 1C, which separates what once was a monolithic fin into two or more separate fins. Monolithic further means the fin was formed of a single large portion of semiconductor material.

Array 200 includes first, second, third, and fourth word lines 221, 222, 289, 290. The array further includes passing word lines 224, 225, 291. A passing word line is a function of context. For example, word line 123 (FIG. 1C) is passing with regard to the cell including device 101 but is not passing with regard to cell 161.

Array 200 includes first, second, third, and fourth channels 272, 273, 274, 275 included in fin 271. The first channel 272 is between the substrate 270 and the first word line 221, the second channel 273 is between the substrate and the second word line 222. Array 200 includes first, second, third, and fourth capacitors 211, 212, 276, 277. Each of the capacitors may include ferroelectric materials such as, for example, oxygen and at least one of hafnium, zirconium, barium, titanium, lead, or combinations thereof.

Array 200 includes bit line 231, as well as interconnects 231', 231" that couple cells to bit line 231. Semiconductor S/D node 280 couples capacitor 211 to channel 272. Semiconductor node 281 couples bit line 231 to channel 272. Semiconductor S/D node 282 couples capacitor 212 to channel 273. Semiconductor S/D node 283 couples capacitor 276 to channel 274 and semiconductor S/D node 284 couples bit line 231 to channel 274. Semiconductor S/D node 285 couples capacitor 277 to channel 275.

Fin 271 includes long axis 286 and a fin portion 287 between semiconductor nodes 282, 283. Axis 286 intersects channels 272, 273, 274, 275 and fin portion 287. Instead of gap 164 or 165 (see FIG. 1C) or STI 151, 152 (see FIG. 1B), fin portion 287 is yet another portion of monolithic fin 271. Fin 271 includes a first half 271' and a second half 271" with the second half 271" between the first half 271' and the substrate 270. Axis 286 intersects first half 271'. For example, fin 271 is continuous and uninterrupted between nodes 280 and 285 (and beyond). Further, plane 288 is parallel to long axis 286. Plane 288 intersects channels 272, 273, 274, 275, word lines 225, 221, 222, 224, 289, 290, 291, bit line 231 as well as bit line interconnects 231', 231", and capacitors 211, 212, 276, 277.

In an embodiment array 200 is included in DRAM, such as eDRAM. Embedded memory is non-stand-alone memory. It may be an integrated on-chip memory that supports a logic core to accomplish intended functions. It may be located in the same die as a processor or on a die that is included in the same package (e.g., see FIG. 3) as the processor.

As described above, word line 223 (or word line 224 in FIG. 2B) may be a passing word line that is a word line that operates a memory cell not shown in FIG. 2A. Such a memory cell may be located just "above" or "below" the 2D planar rendering of FIG. 2A. As mentioned elsewhere herein, a passing word line is a function of context where the word line may pass a first cell and not operate to activate that cell but may indeed operate a second cell. In other embodiments, word line 223 is a dummy word line.

Figure 3:
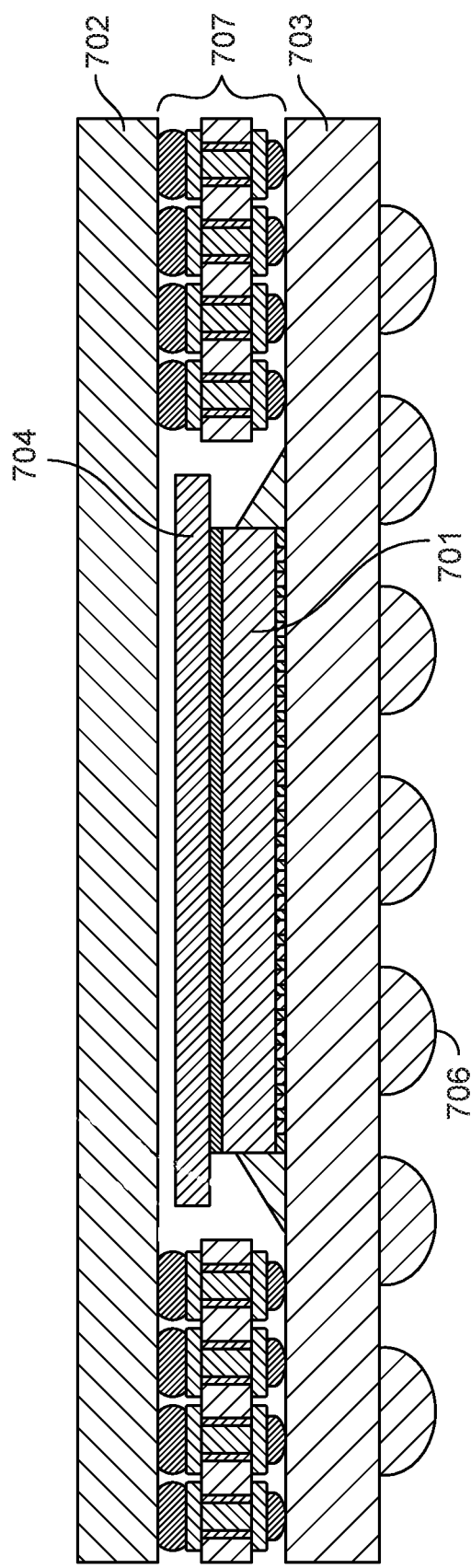
FIGS. 3, 4, 5, and 6 include systems that include embodiments.

FIG. 3 includes a package system in an embodiment. The system includes a processor die 701 (a first package) on a package substrate 703. A memory die (a second package) 702 couples to the substrate 703 by way of interposer system 707. Underfill material exists between die 701 and substrate 703. Substrate 703 may include controlled collapse chip connection (C4) interconnects 706. Further, to prevent warping of die 701, die 701 may couple to a metal stiffener 704. Die 701 may include a die stack (e.g., multiple dies which may have the same function or differing functions) that may be molded as one unit that functions as a single die. For example, one die of the stack may have a first logic function while another die of the stack has another logic function that differs from the first logic function.

In the embodiment of FIG. 3, die 702 may include the memory arrays of FIGS. 2A and/or 2B and/or other embodiments described herein. In another embodiment die 701 includes the memory arrays of FIGS. 2A and/or 2B and/or other embodiments described herein. In an embodiment die 701 includes the memory arrays of FIGS. 2A and/or 2B and/or other embodiments described herein and die 702 includes the memory arrays of FIGS. 2A and/or 2B and/or other embodiments described herein.

In an embodiment element 704 is not a stiffener but instead is a heat spreader (or is both a stiffener and a heat spreader). A heat spreader is a heat exchanger that moves heat between a heat source and a secondary heat exchanger whose surface area and geometry are more favorable than the source. Such a spreader may be a plate made of copper, which has a high thermal conductivity. By definition, heat is "spread out" over this geometry, so that the secondary heat exchanger may be more fully utilized. This has the potential to increase the heat capacity of the total assembly.

Thus, FIG. 3 depicts an integrated circuit and a memory on a package substrate. The integrated circuit may include the memory arrays of FIGS. 2A and/or 2B and/or other embodiments described herein. For example, the circuit may include eDRAM including the memory arrays of FIGS. 2A and/or 2B and/or other embodiments described herein. For example, the circuit may be a field programmable gate array (FPGA) including the memory arrays of FIGS. 2A and/or 2B and/or other embodiments described herein.

Figure 4:
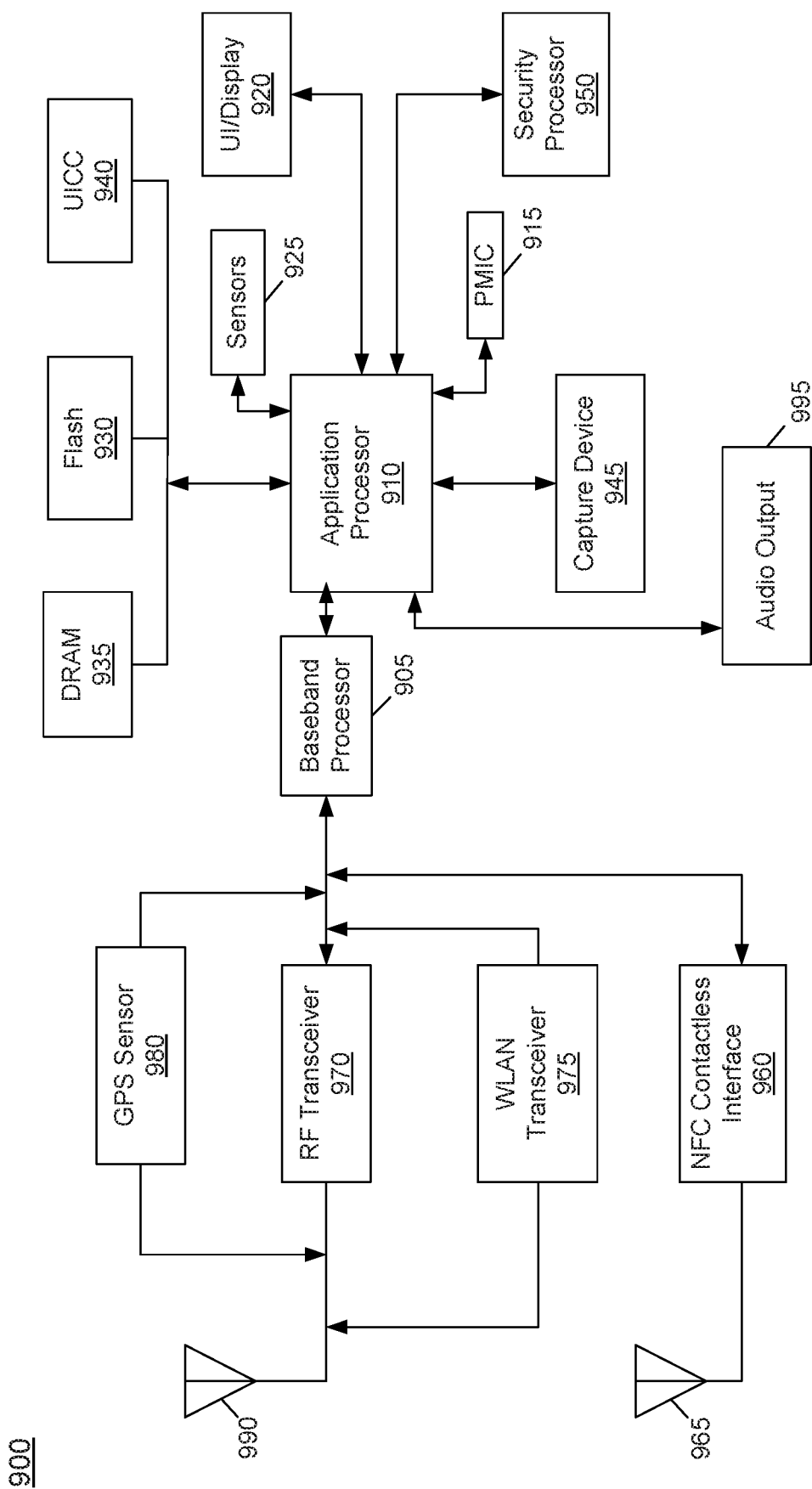

Referring now to FIG. 4, shown is a block diagram of an example system with which embodiments can be used. As seen, system 900 may be a smartphone or other wireless communicator or any other Internet of Things (IoT) device. A baseband processor 905 (which may include the memory arrays of FIGS. 2A and/or 2B and/or other embodiments described herein) is configured to perform various signal processing with regard to communication signals to be transmitted from or received by the system. In turn, baseband processor 905 is coupled to an application processor 910, which may be a main CPU (which may include the memory arrays of FIGS. 2A and/or 2B and/or other embodiments described herein) of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory (which may include the memory arrays of FIGS. 2A and/or 2B and/or other embodiments described herein), namely a flash memory 930 and a system memory, namely a DRAM 935. As further seen, application processor 910 also couples to audio output 995 and a capture device 945 such as one or more image capture devices (which may include the memory arrays of FIGS. 2A and/or 2B and/or other embodiments described herein) that can record video and/or still images.

A universal integrated circuit card (UICC) 940 (which may include the memory arrays of FIGS. 2A and/or 2B and/or other embodiments described herein) comprises a subscriber identity module, which in some embodiments includes a secure storage to store secure user information. System 900 may further include a security processor 950 (e.g., Trusted Platform Module (TPM)) (which may include the memory arrays of FIGS. 2A and/or 2B and/or other embodiments described herein) that may couple to application processor 910. A plurality of sensors 925, including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G or 5G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 5:
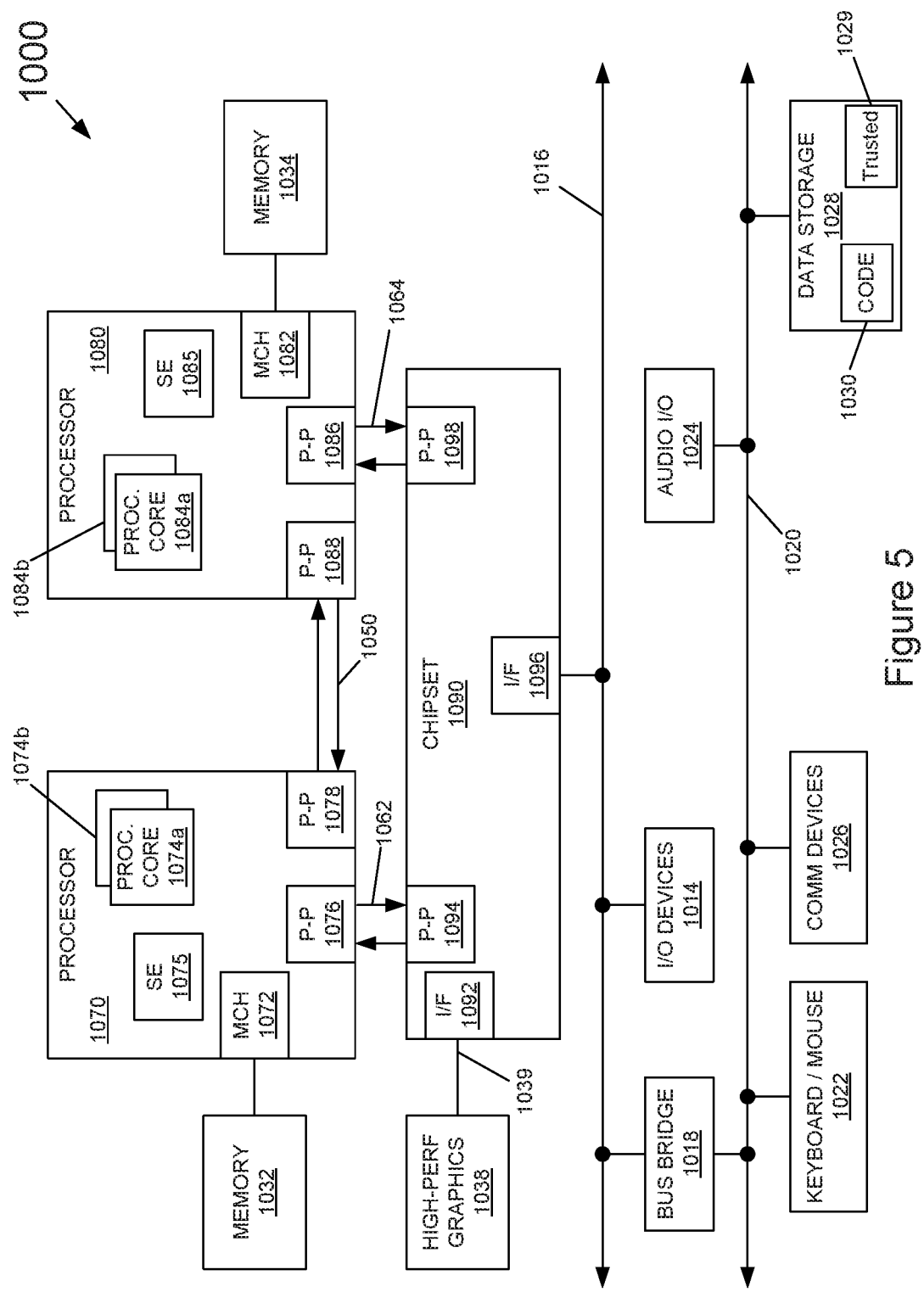

Referring now to FIG. 5, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors (which may include the memory arrays of FIGS. 2A and/or 2B and/or other embodiments described herein) such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034 (which may include the memory arrays of FIGS. 2A and/or 2B and/or other embodiments described herein), which may be portions of main memory (e.g., a DRAM) locally attached to the respective processors. First processor 1070 and second processor 1080 may be coupled to a chipset 1090 via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038 (which may include the memory arrays of FIGS. 2A and/or 2B and/or other embodiments described herein), by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 (which may include the memory arrays of FIGS. 2A and/or 2B and/or other embodiments described herein) such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 6:
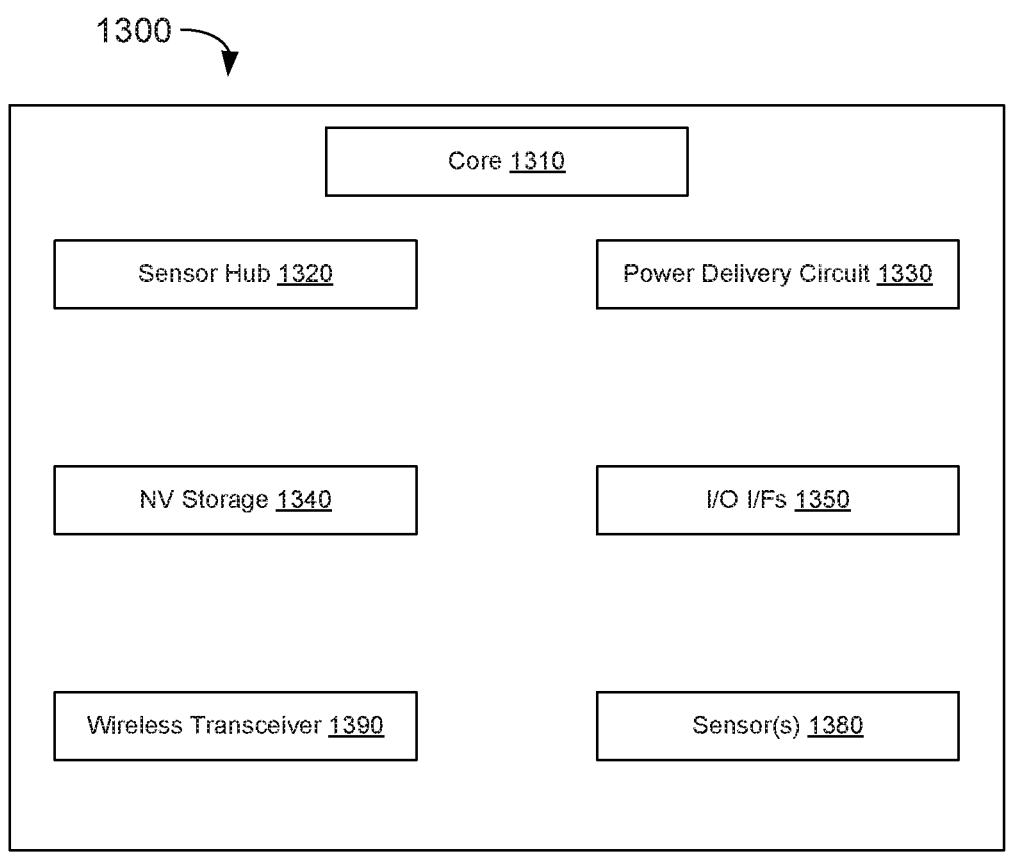

Referring now to FIG. 6, embodiments may be used in environments where IoT devices may include wearable devices or other small form factor IoT devices. Shown is a block diagram of a wearable module 1300 in accordance with another embodiment. In one particular implementation, module 1300 (which may include the memory arrays of FIGS. 2A and/or 2B and/or other embodiments described herein) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340 (which may include the memory arrays of FIGS. 2A and/or 2B and/or other embodiments described herein). In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. In different implementations a wearable module can take many other forms. Wearable and/or IoT devices have, in comparison with a typical general purpose CPU or a GPU, a small form factor, low power requirements, limited instruction sets, relatively slow computation throughput, or any of the above.

FIG. 7 includes a method 700 in an embodiment. Block 701 includes forming a monolithic fin that includes a semiconductor material. The monolithic fin is formed at once and is contiguous and maintains a relatively consistent height and width from one end of the fin to the opposing end of the fin. Block 702 includes forming first, second, third, and fourth channels in the fin. Block 703 includes forming first, second, third, fourth, fifth, and sixth semiconductor nodes in the fin. Block 704 includes forming first, second, third, and fourth word lines on the fin, wherein the first channel is between a bottom of the fin and the first word line, the second channel is between the bottom of the fin and the second word line, the third channel is between the bottom of the fin and the third word line, and the fourth channel is between the bottom of the fin and the fourth word line. Block 705 includes forming first, second, third, and fourth capacitors, wherein the first, second, and third capacitors include ferroelectric materials. Block 706 includes forming a bit line, wherein the first semiconductor node couples the first capacitor to the first channel, the second semiconductor node couples the bit line to the first channel, the second semiconductor node couples the bit line to the second channel; the third semiconductor node couples the second capacitor to the second channel, the fourth semiconductor node couples the third capacitor to the third channel, the fifth semiconductor node couples the bit line to the third channel, the fifth semiconductor node couples the bit line to the fourth channel, and the sixth semiconductor node couples the fourth capacitor to the fourth channel.

The following examples pertain to further embodiments.

Example 1. A system comprising: a substrate; a monolithic fin on the substrate, the fin including a semiconductor material; first, second, third, and fourth word lines; first, second, third, and fourth channels included in the fin, wherein the first channel is between the substrate and the first word line, the second channel is between the substrate and the second word line, the third channel is between the substrate and the third word line, and the fourth channel is between the substrate and the fourth word line; first, second, third, and fourth capacitors, wherein the first capacitor includes lead, zirconium, and titanium, the second capacitor includes lead, zirconium, and titanium, the third capacitor includes lead, zirconium, and titanium, and the fourth capacitor includes lead, zirconium, and titanium; first and second bit lines; first, second, third, fourth, fifth, and sixth semiconductor nodes, wherein the first semiconductor node couples the first capacitor to the first channel, the second semiconductor node couples the first bit line to the first channel; the third semiconductor node couples the second capacitor to the second channel, the fourth semiconductor node couples the third capacitor to the third channel, the fifth semiconductor node couples the second bit line to the third channel, and the sixth semiconductor node couples the fourth capacitor to the fourth channel.

Another version of Example 1. A system comprising: a substrate; a monolithic fin on the substrate, the fin including a semiconductor material; first, second, third, and fourth word lines; first, second, third, and fourth channels included in the fin, wherein the first channel is between the substrate and the first word line, the second channel is between the substrate and the second word line, the third channel is between the substrate and the third word line, and the fourth channel is between the substrate and the fourth word line; first, second, third, and fourth capacitors, wherein the first capacitor includes lead, zirconium, and titanium, the second capacitor includes lead, zirconium, and titanium, the third capacitor includes lead, zirconium, and titanium, and the fourth capacitor includes lead, zirconium, and titanium; a bit line; first, second, third, fourth, fifth, and sixth semiconductor nodes, wherein the first semiconductor node couples the first capacitor to the first channel, the second semiconductor node couples the bit line to the first channel; the third semiconductor node couples the second capacitor to the second channel, the fourth semiconductor node couples the third capacitor to the third channel, the fifth semiconductor node couples the bit line to the third channel, and the sixth semiconductor node couples the fourth capacitor to the fourth channel.

While not easily seen in FIG. 2B, ferroelectric capacitors may include several layers. For example, a bottom metal layer may include a deposited (e.g., atomic layer deposition) ferroelectric material. The ferroelectric material may be covered with another metal, which is in turn coupled to a common plate.

While in FIG. 2B the bit line is above or on the capacitors, in other embodiments the bit line may be below the capacitors.

Example 2. The system of example 2, wherein: the second semiconductor node couples the first bit line to the second channel; the fifth semiconductor node couples the second bit line to the fourth channel.

Example 3. The system of example 2, wherein: the first semiconductor node includes one of a source node and a drain node, the second semiconductor node includes another of the source node and the drain node.

Example 4. The system of example 3, wherein: the third semiconductor node includes the one of a source node and a drain node, the fourth semiconductor node includes the one of a source node and a drain node, the sixth semiconductor node includes the one of a source node and a drain node, the fifth semiconductor node includes the another of the source node and the drain node.

Example 5. The system of example 4 comprising a fifth word line, wherein: the fin is between the substrate and the fifth word line; the fifth word line is between the second and third word lines.

Example 6. The system of example 5 comprising a second semiconductor fin having a fifth channel, wherein the fifth channel is between the substrate and the fifth word line.

Example 7. The system of example 4 wherein: the fin includes a long axis and a short axis; the fin includes a fin portion between the third and fourth semiconductor nodes; the long axis intersects the first, second, third, and fourth channels; the long axis intersects the fin portion.

Example 8. The system of example 7 wherein: the fin includes a first half and a second half; the second half is between the first half and the substrate; the long axis intersects the first half.

Example 9. The system of example 8 comprising first, second, third, and fourth memory cells, wherein the first memory cell includes first channel and the first capacitor, the second memory cell includes the second channel and the second capacitor, the third memory cell includes the third channel and the third capacitor, and the fourth memory cell includes the fourth capacitor.

Example 10. The system of example 9 wherein: a plane is parallel to the long axis; the plane intersects the first, second, third, and fourth channels; the plane intersects the first, second, third, and fourth word lines; the plane intersects the first and second bit lines.

Example 11. The system of example 10 wherein the plane intersects the first, second, third, and fourth capacitors.

Example 12. The system of example 10 comprising dynamic random access memory (DRAM), wherein the DRAM includes the first, second, third, and fourth memory cells.

However, in other embodiments the memory may include MRAM, RRAM, and the like.

Example 13. The system of example 10 comprising a processor on the substrate, wherein the processor is coupled to the first, second, third, and fourth memory cells.

Example 14. The system of example 10 wherein there is no additional memory cell between the second and third memory cells.

Example 15. A system comprising: first, second, and third word lines on a semiconductor material; first, second, and third channels, wherein the first word line is one the first channel, the second word line is on the second channel, and the third word line is on the third channel; first, second, and third capacitors including a ferroelectric material; first and second bit lines; first, second, third, fourth, and fifth semiconductor nodes, wherein the first semiconductor node couples the first capacitor to the first channel, the second semiconductor node couples the first bit line to the first channel; the third semiconductor node couples the second capacitor to the second channel, the fourth semiconductor node couples the third capacitor to the third channel, and the fifth semiconductor node couples the second bit line to the third channel; wherein: (a)(i) the first, second, and third channels are included in the semiconductor material; (a)(ii) the first, second, third, fourth, and fifth semiconductor nodes are included in the semiconductor material; wherein the first channel has a long axis and a short axis; wherein the long axis intersects a continuous, uninterrupted portion of the semiconductor material from the first channel to the third channel.

Example 16. The system of example 2, wherein: the second semiconductor node couples the first bit line to the second channel; the first semiconductor node includes one of a source node and a drain node, the second semiconductor node includes another of the source node and the drain node.

Example 17. The system of example 16 comprising first, second, third, and fourth memory cells, wherein the first memory cell includes the first channel and the first capacitor, the second memory cell includes the second channel and the second capacitor, and the third memory cell includes the third channel and the third capacitor.

Example 18. The system of example 17 wherein: a plane is parallel to the long axis; the plane intersects the first, second, and third channels; the plane intersects the first, second, and third word lines; the plane intersects the first and second bit lines.

Example 19. The system of example 19 wherein the plane intersects the first, second, third capacitors.

Example 20. The system of example 18 comprising: a processor; dynamic random access memory (DRAM) that includes the first, second, and third memory cells; a package that includes the processor and the DRAM.

Example 21. The system of example 15 wherein: the ferroelectric material includes oxygen; the ferroelectric material includes at least one of hafnium, zirconium, barium, titanium, lead, and combinations thereof.

Example 1a. A system comprising: a monolithic fin that includes a semiconductor material; first, second, third, and fourth word lines; first, second, third, and fourth channels included in the fin, wherein the first channel is between a bottom of the fin and the first word line, the second channel is between the bottom of the fin and the second word line, the third channel is between the bottom of the fin and the third word line, and the fourth channel is between the bottom of the fin and the fourth word line; first, second, third, and fourth capacitors, wherein the first capacitor includes lead, zirconium, and titanium, the second capacitor includes lead, zirconium, and titanium, the third capacitor includes lead, zirconium, and titanium, and the fourth capacitor includes lead, zirconium, and titanium; a bit line; first, second, third, fourth, fifth, and sixth semiconductor nodes, wherein the first semiconductor node couples the first capacitor to the first channel, the second semiconductor node couples the bit line to the first channel; the third semiconductor node couples the second capacitor to the second channel, the fourth semiconductor node couples the third capacitor to the third channel, the fifth semiconductor node couples the bit line to the third channel, and the sixth semiconductor node couples the fourth capacitor to the fourth channel.

Example 2a. The system of example 1a, wherein: the second semiconductor node couples the bit line to the second channel; the fifth semiconductor node couples the bit line to the fourth channel.

Example 3a. The system of example 2a, wherein: the first semiconductor node includes one of a source node and a drain node, the second semiconductor node includes another of the source node and the drain node.

Example 4a. The system of example 3a, wherein: the third semiconductor node includes the one of a source node and a drain node, the fourth semiconductor node includes the one of a source node and a drain node, the sixth semiconductor node includes the one of a source node and a drain node, the fifth semiconductor node includes the another of the source node and the drain node.

Example 5a. The system of example 4a comprising a fifth word line, wherein the fifth word line is on the fin and between the second and third word lines.

Example 6a. The system of example 5a comprising an additional semiconductor fin having a fifth channel, wherein: the additional fin is not monolithic with the fin; the fifth channel is between a bottom of the additional fin and the fifth word line.

Example 7a. The system of example 4a wherein: the fin includes a long axis and a short axis; the fin includes a fin portion between the third and fourth semiconductor nodes; the long axis intersects the first, second, third, and fourth channels; the long axis intersects the fin portion.

Example 8a. The system of example 7a wherein: the fin includes a first half and a second half; the second half is between the first half and the bottom of the fin; the long axis intersects the first half.

Example 9a. The system of example 8a comprising first, second, third, and fourth memory cells, wherein the first memory cell includes first channel and the first capacitor, the second memory cell includes the second channel and the second capacitor, the third memory cell includes the third channel and the third capacitor, and the fourth memory cell includes the fourth capacitor.

Example 10a. The system of example 9a wherein: a plane is parallel to the long axis; the plane intersects the first, second, third, and fourth channels; the plane intersects the first, second, third, and fourth word lines; the plane intersects the bit line.

Example 11a. The system of example 10a wherein the plane intersects the first, second, third, and fourth capacitors.

Example 12a. The system of example 10a comprising dynamic random access memory (DRAM), wherein the DRAM includes the first, second, third, and fourth memory cells.

Example 13a. The system of example 10a comprising a processor on a substrate, wherein: the processor is coupled to the first, second, third, and fourth memory cells; the fin is on the substrate.

Example 14a. The system of example 10a comprising: an integrated circuit; a memory comprising the first, second, third, and fourth memory cells; and a package housing that includes the integrated circuit and the memory.

Another version of Example 14a. The system of example 10a comprising: an integrated circuit on a first die; a memory on a second die, the memory comprising the first, second, third, and fourth memory cells; and the first and second die on a package substrate.

Example 15a. The system of example 14a wherein the integrated circuit comprises a field programmable gate array (FPGA).

Example 16a. The system of example 14a comprising: a radiofrequency receiver; and a chassis; wherein the chassis includes the radiofrequency receiver and the package.

Another version of Example 16a. The system of example 14a comprising: a radiofrequency receiver; and a chassis; wherein the chassis includes the radiofrequency receiver and the package substrate.

Example 17a. The system of example 9a wherein there is no additional memory cell between the second and third memory cells.

Example 18a. The system of example 9a wherein there is no shallow trench isolation (STI) that: (a) is between the second and third memory cells, (b) is included in the fin, and (c) intersects the long axis.

Example 19a. A system comprising: first, second, and third word lines on a semiconductor material; first, second, and third channels, wherein the first word line is one the first channel, the second word line is on the second channel, and the third word line is on the third channel; first, second, and third capacitors including a ferroelectric material; a bit line; first, second, third, fourth, and fifth semiconductor nodes, wherein the first semiconductor node couples the first capacitor to the first channel, the second semiconductor node couples the bit line to the first channel; the third semiconductor node couples the second capacitor to the second channel, the fourth semiconductor node couples the third capacitor to the third channel, and the fifth semiconductor node couples the bit line to the third channel; wherein: (a)(i) the first, second, and third channels are included in the semiconductor material; (a)(ii) the first, second, third, fourth, and fifth semiconductor nodes are included in the semiconductor material; wherein the first channel has a long axis and a short axis; wherein the long axis intersects a continuous, uninterrupted portion of the semiconductor material, the portion of the semiconductor material extending from the first channel to the third channel.

Example 20a. The system of example 19a, wherein: the second semiconductor node couples the bit line to the second channel; the first semiconductor node includes one of a source node and a drain node, the second semiconductor node includes another of the source node and the drain node.

Example 21a. The system of example 20a comprising first, second, and third memory cells, wherein the first memory cell includes the first channel and the first capacitor, the second memory cell includes the second channel and the second capacitor, and the third memory cell includes the third channel and the third capacitor.

Example 22a. The system of example 21a wherein: a plane is parallel to the long axis; the plane intersects the first, second, and third channels; the plane intersects the first, second, and third word lines; the plane intersects the bit line.

Example 23a. The system of example 22a wherein the plane intersects the first, second, third capacitors.

Example 24a. The system of example 21a comprising: a processor; dynamic random access memory (DRAM) that includes the first, second, and third memory cells; a package that includes the processor and the DRAM.

Example 25a. The system of example 19a wherein: the ferroelectric material includes oxygen; the ferroelectric material includes at least one of hafnium, zirconium, barium, titanium, lead, and combinations thereof.

Example 1b. A method comprising: forming a monolithic fin that includes a semiconductor material; forming first, second, third, and fourth channels in the fin; forming first, second, third, fourth, fifth, and sixth semiconductor nodes in the fin; forming first, second, third, and fourth word lines on the fin, wherein the first channel is between a bottom of the fin and the first word line, the second channel is between the bottom of the fin and the second word line, the third channel is between the bottom of the fin and the third word line, and the fourth channel is between the bottom of the fin and the fourth word line; forming first, second, third, and fourth capacitors, wherein the first, second, and third capacitors include lead, zirconium, and titanium; and forming a bit line, wherein the first semiconductor node couples the first capacitor to the first channel, the second semiconductor node couples the bit line to the first channel, the second semiconductor node couples the bit line to the second channel; the third semiconductor node couples the second capacitor to the second channel, the fourth semiconductor node couples the third capacitor to the third channel, the fifth semiconductor node couples the bit line to the third channel, the fifth semiconductor node couples the bit line to the fourth channel, and the sixth semiconductor node couples the fourth capacitor to the fourth channel.

Example 2B. The method of example 1B, wherein: the first channel includes a long axis; the first, second, third, and fourth channels are respectively included in first, second, third, and fourth memory cells; the second and third memory cells are between the first and fourth memory cells; there is no shallow trench isolation (STI) that: (a) is between the second and third memory cells, (b) is included in the fin, and (c) intersects the long axis.

Example 1c. A system comprising: a monolithic fin that includes a semiconductor material; first, second, third, and fourth word lines; first, second, third, and fourth channels included in the fin, wherein the first channel is between a bottom of the fin and the first word line, the second channel is between the bottom of the fin and the second word line, the third channel is between the bottom of the fin and the third word line, and the fourth channel is between the bottom of the fin and the fourth word line; first, second, third, and fourth capacitors, wherein the first capacitor includes lead, zirconium, and titanium, the second capacitor includes lead, zirconium, and titanium, the third capacitor includes lead, zirconium, and titanium, and the fourth capacitor includes lead, zirconium, and titanium; a bit line; first, second, third, fourth, fifth, and sixth semiconductor nodes, wherein the first semiconductor node couples the first capacitor to the first channel, the second semiconductor node couples the bit line to the first channel; the third semiconductor node couples the second capacitor to the second channel, the fourth semiconductor node couples the third capacitor to the third channel, the fifth semiconductor node couples the bit line to the third channel, and the sixth semiconductor node couples the fourth capacitor to the fourth channel.

Example 2c. The system of example 1c, wherein: the second semiconductor node couples the bit line to the second channel; the fifth semiconductor node couples the bit line to the fourth channel.

Example 3c. The system of example 2c, wherein: the first semiconductor node includes one of a source node and a drain node, the second semiconductor node includes another of the source node and the drain node.

Example 4c. The system of example 3c, wherein: the third semiconductor node includes the one of a source node and a drain node, the fourth semiconductor node includes the one of a source node and a drain node, the sixth semiconductor node includes the one of a source node and a drain node, the fifth semiconductor node includes the another of the source node and the drain node.

Example 5c. The system according to any of examples 1c to 4c comprising a fifth word line, wherein the fifth word line is on the fin and between the second and third word lines.

The fifth word line may be a passing word line or a dummy word line.

Example 6c. The system of example 5c comprising an additional semiconductor fin having a fifth channel, wherein: the additional fin is not monolithic with the fin; the fifth channel is between a bottom of the additional fin and the fifth word line.

Another version of Example 6c: The system of example 5c comprising an additional semiconductor fin having a fifth channel, wherein: the fifth channel is included in a memory cell; the additional fin is not monolithic with the fin; the fifth channel is between a bottom of the additional fin and the fifth word line.

The fifth word line may be a passing word line.

Example 7c. The system according to any of examples 1c to 6c wherein: the fin includes a long axis and a short axis; the fin includes a fin portion between the third and fourth semiconductor nodes; the long axis intersects the first, second, third, and fourth channels; the long axis intersects the fin portion.

Example 8c. The system of example 7c wherein: the fin includes a first half and a second half; the second half is between the first half and the bottom of the fin; the long axis intersects the first half.

Example 9c. The system of example 8c comprising first, second, third, and fourth memory cells, wherein the first memory cell includes first channel and the first capacitor, the second memory cell includes the second channel and the second capacitor, the third memory cell includes the third channel and the third capacitor, and the fourth memory cell includes the fourth capacitor.

Example 10c. The system of example 9c wherein: a plane is parallel to the long axis; the plane intersects the first, second, third, and fourth channels; the plane intersects the first, second, third, and fourth word lines; the plane intersects the bit line.

Example 11c. The system according to any of examples 9c to 10c wherein the plane intersects the first, second, third, and fourth capacitors.

Example 12c. The system according to any of examples 9c to 10c comprising dynamic random access memory (DRAM), wherein the DRAM includes the first, second, third, and fourth memory cells.

Example 13c. The system according to any of examples 9c to 10c comprising a processor on a substrate, wherein: the processor is coupled to the first, second, third, and fourth memory cells; the fin is on the substrate.

Example 14c. The system according to any of examples 9c to 10c comprising: an integrated circuit on a first die; a memory on a second die, the memory comprising the first, second, third, and fourth memory cells; and the first and second die on a package substrate.

Example 15c. The system of example 14c wherein the integrated circuit comprises a field programmable gate array (FPGA).

Example 16c. The system of example 14c comprising: a radiofrequency receiver; and a chassis; wherein the chassis includes the radiofrequency receiver and the package substrate.

Example 17c. The system of example 9c wherein there is no additional memory cell between the second and third memory cells.

Example 18c. The system of example 9c wherein there is no shallow trench isolation (STI) that: (a) is between the second and third memory cells, (b) is included in the fin, and (c) intersects the long axis.

Example 19c. A system comprising: first, second, and third word lines on a semiconductor material; first, second, and third channels, wherein the first word line is one the first channel, the second word line is on the second channel, and the third word line is on the third channel; first, second, and third capacitors including a ferroelectric material; a bit line; first, second, third, fourth, and fifth semiconductor nodes, wherein the first semiconductor node couples the first capacitor to the first channel, the second semiconductor node couples the bit line to the first channel; the third semiconductor node couples the second capacitor to the second channel, the fourth semiconductor node couples the third capacitor to the third channel, and the fifth semiconductor node couples the bit line to the third channel; wherein: (a)(i) the first, second, and third channels are included in the semiconductor material; (a)(ii) the first, second, third, fourth, and fifth semiconductor nodes are included in the semiconductor material; wherein the first channel has a long axis and a short axis; wherein the long axis intersects a continuous, uninterrupted portion of the semiconductor material, the portion of the semiconductor material extending from the first channel to the third channel.

The semiconductor material may include III-V, IV, semiconductor oxides, and the like.

Example 20c. The system of example 19c, wherein: the second semiconductor node couples the bit line to the second channel; the first semiconductor node includes one of a source node and a drain node, the second semiconductor node includes another of the source node and the drain node.

Example 21c. The system according to any of examples 19c to 20c comprising first, second, and third memory cells, wherein the first memory cell includes the first channel and the first capacitor, the second memory cell includes the second channel and the second capacitor, and the third memory cell includes the third channel and the third capacitor.

Example 22c. The system according to any of examples 19c to 21c wherein: a plane is parallel to the long axis; the plane intersects the first, second, and third channels; the plane intersects the first, second, and third word lines; the plane intersects the bit line.

Example 23c. The system of example 22c wherein the plane intersects the first, second, third capacitors.

Example 24c. The system of example 21c comprising: a processor; dynamic random access memory (DRAM) that includes the first, second, and third memory cells; a package that includes the processor and the DRAM.

Example 25c. The system according to any of examples 19c to 24c wherein: the ferroelectric material includes oxygen; the ferroelectric material includes at least one of hafnium, zirconium, barium, titanium, lead, and combinations thereof.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:
1. A system comprising:
a monolithic fin that includes a semiconductor material;

first, second, third, and fourth word lines;
first, second, third, and fourth channels included in the fin, wherein the first channel is between a bottom of the fin and the first word line, the second channel is between the bottom of the fin and the second word line, the third channel is between the bottom of the fin and the third word line, and the fourth channel is between the bottom of the fin and the fourth word line;
first, second, third, and fourth capacitors, wherein the first capacitor includes oxygen and at least one of hafnium, zirconium, barium, titanium, lead, or combinations thereof, the second capacitor includes oxygen and at least one of hafnium, zirconium, barium, titanium, lead, or combinations thereof, the third capacitor includes oxygen and at least one of hafnium, zirconium, barium, titanium, lead, or combinations thereof, and the fourth capacitor includes oxygen and at least one of hafnium, zirconium, barium, titanium, lead, or combinations thereof;
a bit line; and
first, second, third, fourth, fifth, and sixth semiconductor nodes, wherein the first semiconductor node couples the first capacitor to the first channel, the second semiconductor node couples the bit line to the first channel; the third semiconductor node couples the second capacitor to the second channel, the fourth semiconductor node couples the third capacitor to the third channel, the fifth semiconductor node couples the bit line to the third channel, and the sixth semiconductor node couples the fourth capacitor to the fourth channel.

2. The system of claim 1, wherein:
the second semiconductor node couples the bit line to the second channel;
the fifth semiconductor node couples the bit line to the fourth channel.

3. The system of claim 2, wherein:
the first semiconductor node includes one of a source node or a drain node;
the second semiconductor node includes another of the source node or the drain node.

4. The system of claim 3, wherein:
the third semiconductor node includes the one of a source node or a drain node;
the fourth semiconductor node includes the one of a source node or a drain node;
the sixth semiconductor node includes the one of a source node or a drain node;
the fifth semiconductor node includes the another of the source node or the drain node.

5. The system of claim 4 comprising a fifth word line, wherein:
the fifth word line is on the fin; and
the fifth word line is between the second and third word lines.

6. The system of claim 5 comprising an additional semiconductor fin having a fifth channel, wherein:
the fifth channel is included in a memory cell;
the additional fin is not monolithic with the fin;
the fifth channel is between a bottom of the additional fin and the fifth word line.

7. The system of claim 4 wherein:
the fin includes a long axis and a short axis;
the fin includes a fin portion between the third and fourth semiconductor nodes;
the long axis intersects the first, second, third, and fourth channels;
the long axis intersects the fin portion.

8. The system of claim 7 wherein:
the fin includes a first half and a second half;
the second half is between the first half and the bottom of the fin;
the long axis intersects the first half.

9. The system of claim 8 comprising first, second, third, and fourth memory cells, wherein the first memory cell includes the first channel and the first capacitor, the second memory cell includes the second channel and the second capacitor, the third memory cell includes the third channel and the third capacitor, and the fourth memory cell includes the fourth capacitor.

10. The system of claim 9 wherein:
a plane is parallel to the long axis;
the plane intersects the first, second, third, and fourth channels;
the plane intersects the first, second, third, and fourth word lines;
the plane intersects the bit line.

11. The system of claim 10 wherein the plane intersects the first, second, third, and fourth capacitors.

12. The system of claim 10 comprising dynamic random access memory (DRAM), wherein the DRAM includes the first, second, third, and fourth memory cells.

13. The system of claim 10 comprising a processor on a substrate, wherein:
the processor is coupled to the first, second, third, and fourth memory cells;
the fin is on the substrate.

14. The system of claim 9 comprising:
an integrated circuit on a first die;
a memory on a second die, the memory comprising the first, second, third, and fourth memory cells; and
the first and second die on a package substrate.

15. The system of claim 14 wherein the integrated circuit comprises a field programmable gate array (FPGA).

16. The system of claim 14 comprising:
a radiofrequency receiver; and
a chassis;
wherein the chassis includes the radiofrequency receiver and the package substrate.

17. The system of claim 9 wherein there is no additional memory cell between the second and third memory cells.

18. The system of claim 9 wherein there is no shallow trench isolation (STI) that: (a) is between the second and third memory cells, (b) is included in the fin, and (c) intersects the long axis.

19. A system comprising:
first, second, and third word lines on a semiconductor material;
first, second, and third channels, wherein the first word line is one the first channel, the second word line is on the second channel, and the third word line is on the third channel;
first, second, and third capacitors including a ferroelectric material;
a bit line;
first, second, third, fourth, and fifth semiconductor nodes, wherein the first semiconductor node couples the first capacitor to the first channel, the second semiconductor node couples the bit line to the first channel; the third semiconductor node couples the second capacitor to the second channel, the fourth semiconductor node couples the third capacitor to the third channel, and the fifth semiconductor node couples the bit line to the third channel;

wherein: (a)(i) the first, second, and third channels are included in the semiconductor material; (a)(ii) the first, second, third, fourth, and fifth semiconductor nodes are included in the semiconductor material;

wherein the first channel has a long axis and a short axis;

wherein the long axis intersects a continuous, uninterrupted portion of the semiconductor material, the portion of the semiconductor material extending from the first channel to the third channel.

20. The system of claim 19, wherein:

the second semiconductor node couples the bit line to the second channel;

the first semiconductor node includes one of a source node or a drain node;

the second semiconductor node includes another of the source node or the drain node.

21. The system of claim 20 comprising first, second, and third memory cells, wherein the first memory cell includes the first channel and the first capacitor, the second memory cell includes the second channel and the second capacitor, and the third memory cell includes the third channel and the third capacitor.

22. The system of claim 21 wherein:

a plane is parallel to the long axis;

the plane intersects the first, second, and third channels;

the plane intersects the first, second, and third word lines;

the plane intersects the bit line.

23. The system of claim 22 wherein the plane intersects the first, second, third capacitors.

24. The system of claim 21 comprising:

a processor;

dynamic random access memory (DRAM) that includes the first, second, and third memory cells;

a package that includes the processor and the DRAM.

25. The system of claim 19 wherein:

the ferroelectric material includes oxygen;

the ferroelectric material includes at least one of hafnium, zirconium, barium, titanium, lead, or combinations thereof.

* * * * *